US012695268B2

(12) United States Patent
Sakamoto et al.

(10) Patent No.: US 12,695,268 B2
(45) Date of Patent: Jul. 28, 2026

(54) SEMICONDUCTOR OPTICAL DEVICE

(71) Applicant: Lumentum Japan, Inc., Sagamihara (JP)

(72) Inventors: Hironori Sakamoto, Sagamihara (JP); Shigenori Hayakawa, Tokyo (JP)

(73) Assignee: LumentumRadiant GmbH, Baar (CH)

( * ) Notice: Subject to any disclaimer, the term of this patent is extended or adjusted under 35 U.S.C. 154(b) by 781 days.

(21) Appl. No.: 17/648,648

(22) Filed: Jan. 21, 2022

(65) Prior Publication Data

US 2023/0006425 A1     Jan. 5, 2023

(30) Foreign Application Priority Data

Jun. 30, 2021     (JP) ................................. 2021-108431
Nov. 17, 2021     (JP) ................................. 2021-187200

(51) Int. Cl.
*H01S 5/34* (2006.01)
*H01S 5/00* (2006.01)
*H01S 5/026* (2006.01)
*H01S 5/227* (2006.01)
*H01S 5/343* (2006.01)

(52) U.S. Cl.
CPC .......... *H01S 5/0014* (2013.01); *H01S 5/3407* (2013.01); *H01S 5/0265* (2013.01); *H01S 5/227* (2013.01); *H01S 5/3434* (2013.01); *H01S 5/34373* (2013.01); *H01S 2301/17* (2013.01)

(58) Field of Classification Search
CPC ................. H01S 5/0014; H01S 5/3216; H01S 5/3213–3214
See application file for complete search history.

(56) References Cited

U.S. PATENT DOCUMENTS

| | | | | |
|---|---|---|---|---|
| 5,249,195 A | * | 9/1993 | Feldman | ............... H01S 3/0627 |
| | | | | 372/45.01 |
| 5,790,578 A | * | 8/1998 | Takano | ................... B82Y 20/00 |
| | | | | 372/50.1 |
| 6,376,338 B2 | | 4/2002 | Ekawa et al. | |
| 2002/0158259 A1 | * | 10/2002 | Ono | .................... H01S 5/32341 |
| | | | | 257/79 |

(Continued)

FOREIGN PATENT DOCUMENTS

| | | | | |
|---|---|---|---|---|
| JP | 07183617 A | * | 7/1995 | |
| JP | H07-183617 A | | 7/1995 | |
| JP | H11330615 A | | 11/1999 | |

*Primary Examiner* — Sean P Hagan
(74) *Attorney, Agent, or Firm* — Harrity & Harrity, LLP

(57) ABSTRACT

A semiconductor optical device includes a substrate of a first conductivity type; an optical confinement layer of the first conductivity type, which is arranged above the substrate of the first conductivity type; a multi quantum well layer, which is arranged above the optical confinement layer of the first conductivity type, and comprises a plurality of well layers and a plurality of barrier layers; an optical confinement layer of a second conductivity type, which is arranged on the multi quantum well layer; and a PL stabilization layer, which is arranged between the substrate of the first conductivity type and the multi quantum well layer. The PL stabilization layer having a thickness that is half a thickness of the multi quantum well layer or more, and having a composition wavelength that is shorter than a composition wavelength of the plurality of well layers of the multi quantum well layer.

20 Claims, 10 Drawing Sheets

(56)　　　　　　　References Cited

U.S. PATENT DOCUMENTS

| | | | |
|---|---|---|---|
| 2014/0146837 A1* | 5/2014 | Adams ...................... | H01S 5/34 |
| | | | 372/33 |
| 2015/0129835 A1* | 5/2015 | Yamane ............... | H10H 20/812 |
| | | | 257/13 |

* cited by examiner

Excitation light

YAG Laser

301

A                                                A

401

A                    A

SEMICONDUCTOR OPTICAL DEVICE

CROSS-REFERENCE TO RELATED APPLICATION

The present application claims priority to Japanese Patent Application No. 2021-187200 filed in the Japan Patent Office on Nov. 17, 2021, which claims priority to Japanese Patent Application No. 2021-108431 filed on Jun. 30, 2021, the contents of which are hereby expressly incorporated by reference herein.

TECHNICAL FIELD

The present invention relates to a semiconductor optical device.

BACKGROUND

In recent years, there has been an increasing demand for high-speed and large-capacity semiconductor optical devices. Semiconductor optical devices include semiconductor lasers, such as a direct-modulation semiconductor laser and a semiconductor laser which oscillates continuous light. Semiconductor optical devices also include external modulators that modulate laser light (e.g., continuous light) to generate an optical signal, such as an electro-absorption modulator and a Mach-Zehnder modulator. The basic structure of a semiconductor optical device includes a multi quantum well layer (MQW) sandwiched by a p-type semiconductor and an n-type semiconductor. The MQW functions as a layer that generates light when the semiconductor optical device is a semiconductor laser, and functions as an absorption layer when the semiconductor optical device is a modulator. There may be also a structure in which an MQW is sandwiched by optical confinement layers (separated confinement heterostructure (SCH) layers). The SCH layers are arranged in an order to confine light in the MQW with high efficiency, for example. For that reason, each of the SCH layers generally has a refractive index that is smaller than a refractive index of each of well layers and barrier layers forming the MQW. In other words, a composition wavelength of each of the SCH layers is generally shorter than a composition wavelength of each of the well layers and the barrier layers forming the MQW. Each of the SCH layers being shorter in composition wavelength than the MQW indicates a larger band gap, and under forward bias, for example, carriers traveling from an SCH layer toward the MQW can move smoothly.

In some cases, a structure in which two n-type SCH layers are provided so that a composition wavelength of a second confinement layer closer to a semiconductor substrate side is longer than that of each barrier layer. With this structure, carrier capturing time is increased in order to increase frequency modulation efficiency

SUMMARY

Characteristics of a semiconductor optical device strongly depend on a quality of an MQW. The MQW is grown by crystal growth means, for example, a metal organic chemical vapor deposition method (MOCVD method). When SCH layers are formed, upper and lower SCH layers are often grown at once (continuously) so as to sandwich the MQW. As a method of evaluating the quality of the MQW, a photoluminescence measurement (PL measurement) can be used. The PL measurement is a method of evaluating a semiconductor by measuring spontaneous emission light of carriers generated by allowing excitation light to enter a semiconductor from the outside. An excitation light source emits light having a wavelength that is absorbed by a semiconductor layer to be evaluated. When an excitation light source of a wavelength that can be absorbed only by the MQW is used, the spontaneous emission light from the MQW can be measured. However, composition wavelengths of the MQW and each of the SCH layers are often close to each other, and hence a light source which emits light having a wavelength that can be absorbed not only by the MQW but also by the SCH layers is also often used. Consequently, a spectrum of spontaneous emission light that includes both of spontaneous emission light from the MQW and spontaneous emission light from the SCH layers is measured.

Through analysis of the spectrum of the spontaneous emission light, crystal quality can be inspected. However, when an intensity of the spontaneous emission light is low, for example, the spectrum cannot be accurately analyzed. Further, in mass production, when the intensity of the spectrum of the spontaneous emission light differs significantly among lots, it is difficult to determine which is a correct spectrum. Typically, there are several reasons why the intensity of the spontaneous emission light is low. One of the reasons is a case in which the MQW is below desired crystal quality, and hence the excitation light is not absorbed, and the spontaneous emission light is reduced. Another one of the reasons is, for example, a case in which the MQW itself has the structure with which it is difficult to absorb the excitation light (for example, a case in which a thickness of the MQW is thin), and hence an absorption amount of the excitation light is simply small. There is also a case in which an intensity of the excitation light is generally set so that a sufficient intensity of the spontaneous emission light from the MQW is obtained, but desired excitation light is not irradiated on a semiconductor device due to variation in measurement, for example, with the result that the intensity of the spontaneous emission light from the MQW is reduced. Consequently, when the intensity of the evaluation spectrum in the PL measurement is low, there are cases in which it cannot be determined whether crystal quality of the MQW is poor, the MQW has the structure with which the excitation light cannot be sufficiently absorbed, or the MQW has not been sufficiently irradiated with the excitation light, and thus the crystal quality of the MQW cannot be evaluated.

Further, when a semiconductor layer adapted for a 1.3-μm band used in optical communication is evaluated, an yttrium aluminum garnet (YAG) laser having an oscillation wavelength of 1,064 nm is often used as the excitation light source. In an indium phosphide (InP)-based semiconductor optical device, InP is often used for a substrate. Energy of excitation light generated by the YAG laser is smaller than a band gap of InP. For that reason, when the MQW adapted for the 1.3-μm band is crystal grown on the InP substrate, the YAG laser does not excite the InP substrate but excites the MQW, and hence is suitable for evaluating the crystal grown layer alone.

Meanwhile, a composition wavelength of each SCH layer of a 1.3-μm band semiconductor optical device may be set approximately to a range of from 1.00 μm to 1.1 μm. However, a composition wavelength of each SCH layer actually formed in crystal growth is affected by manufacturing variation. For example, even when each SCH layer is designed to have a set wavelength of 1.05 μm, the composition wavelength of each actual SCH layer may be 1.03 μm or 1.07 μm in some cases. At this time, when 1,064 nm (1.064 μm) excitation light is allowed to enter the semiconductor optical device, the excitation light may be absorbed by the SCH layers in some cases, and may not be absorbed by the SCH layers in other cases. When the excitation light is not absorbed by the SCH layers, the excitation light is absorbed only by the MQW, and the spontaneous emission light from the MQW can be measured. As a result, quality of the MQW can be checked. However, when the excitation light is absorbed by the SCH layers, the measured spectrum is the spectrum of the spontaneous emission light including light emitted not only by the MQW but also by the SCH layers. In addition, light is absorbed not only by the MQW but also by the SCH layers, and hence more carriers are excited. Thus, as compared to the case in which light is absorbed only by the MQW, the intensity of the spontaneous emission light from the MQW is changed. If the SCH layers absorb light without fail, quality of grown semiconductor layers can be compared based on the fact that light is absorbed by the SCH layers. However, the composition wavelength of each SCH layer fluctuates due to manufacturing variation. Thus, when light is absorbed by the SCH layers in some cases and light is not absorbed by the SCH layers in other cases among lots, results of the PL measurement vary. Consequently, it is difficult to accurately check the quality of the semiconductor multilayer structure.

In view of the above-mentioned problems, the present disclosure has an object to provide a semiconductor optical device which has the structure that allows evaluation of crystal quality of a semiconductor layer, in particular, a multi quantum well layer, and which has excellent mass productivity.

According to at least one implementation of the present disclosure, there is provided a semiconductor optical device including: a substrate of a first conductivity type; an optical confinement layer of the first conductivity type, which is arranged above the substrate of the first conductivity type; a multi quantum well layer, which is arranged above the optical confinement layer of the first conductivity type, and comprises a plurality of well layers and a plurality of barrier layers; an optical confinement layer of a second conductivity type, which is arranged on the multi quantum well layer; and a PL stabilization layer, which is arranged between the substrate of the first conductivity type and the multi quantum well layer. In the semiconductor optical device, the PL stabilization layer has a thickness that is half a thickness of the multi quantum well layer or more, and the PL stabilization layer has a composition wavelength that is shorter than a composition wavelength of the plurality of well layers of the multi quantum well layer, and is longer than a composition wavelength of the optical confinement layer of the first conductivity type.

According to the at least one implementation of the present disclosure, the crystal quality of the multi quantum well layer of the semiconductor optical device can be stably inspected, and hence stable mass productivity is achieved.

DETAILED DESCRIPTION

Figure 1:
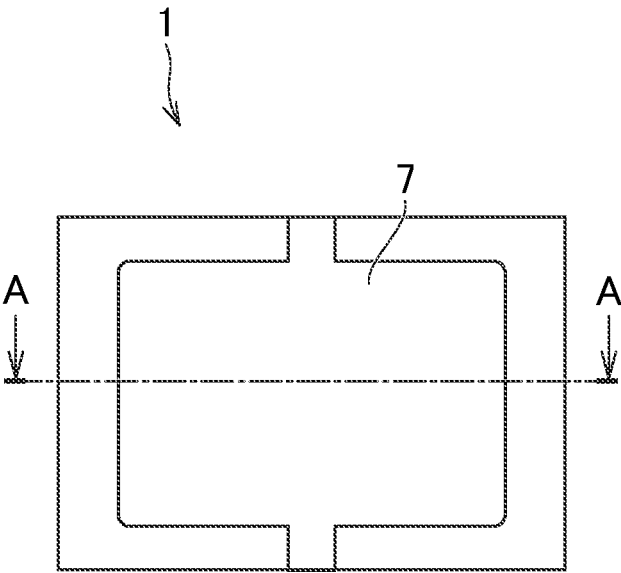
FIG. 1 is a top view of a semiconductor optical device according to a first example implementation of the present disclosure.

Some implementations are specifically described in detail in the following with reference to drawings. In the drawings, the same members are denoted by the same reference numerals and have the same or equivalent functions, and a repetitive description thereof is omitted for the sake of simplicity. Note that, the drawings referred to in the following are only for illustrating the example implementations, and are not necessarily drawn to scale.

Figure 2:
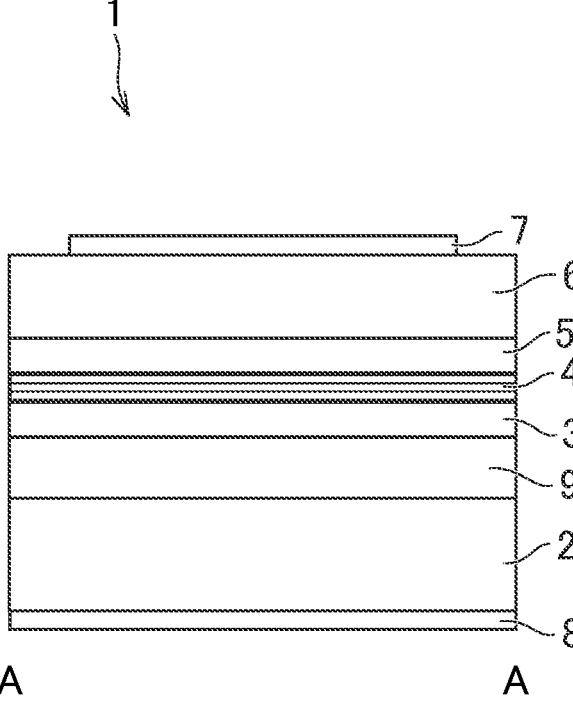
FIG. 2 is a sectional view taken along the line A-A of FIG. 1.

FIG. 1 is a top view of a semiconductor optical device 1 according to a first example implementation of the present disclosure. The semiconductor optical device 1 may be a semiconductor laser. FIG. 2 is a schematic sectional view taken along the line A-A of FIG. 1, which is perpendicular to an optical axis. The semiconductor optical device 1 may have a structure in which a PL stabilization layer 9, an n-type optical confinement layer (n-type SCH layer) 3, a multi quantum well layer (MQW) 4, a p-type SCH layer 5, and a p-type cladding layer 6 are grown in the stated order on an n-type substrate (substrate 2). The semiconductor optical device 1 may include a top electrode 7 and a back electrode 8. The top electrode 7 may be in contact with the p-type cladding layer 6, and the back electrode 8 may be in contact with the n-type substrate (substrate 2). Through application of a voltage (injecting an electric current) between the two electrodes, the MQW 4 may emit light. The n-type and the p-type may be inverted. Further, in order to reduce an electrical resistance, a contact layer may be arranged between the p-type cladding layer 6 and the top electrode 7.

In this example, the PL stabilization layer 9 may be a layer having a longer composition wavelength (smaller band gap) than that of the n-type SCH layer 3. Further, the PL stabilization layer 9 may have a composition wavelength with which excitation light from an excitation light source (described herein) can be absorbed.

Figure 3:
FIG. 3 is a sectional view in course of manufacturing the semiconductor optical device according to the first example implementation.
Figure 3:
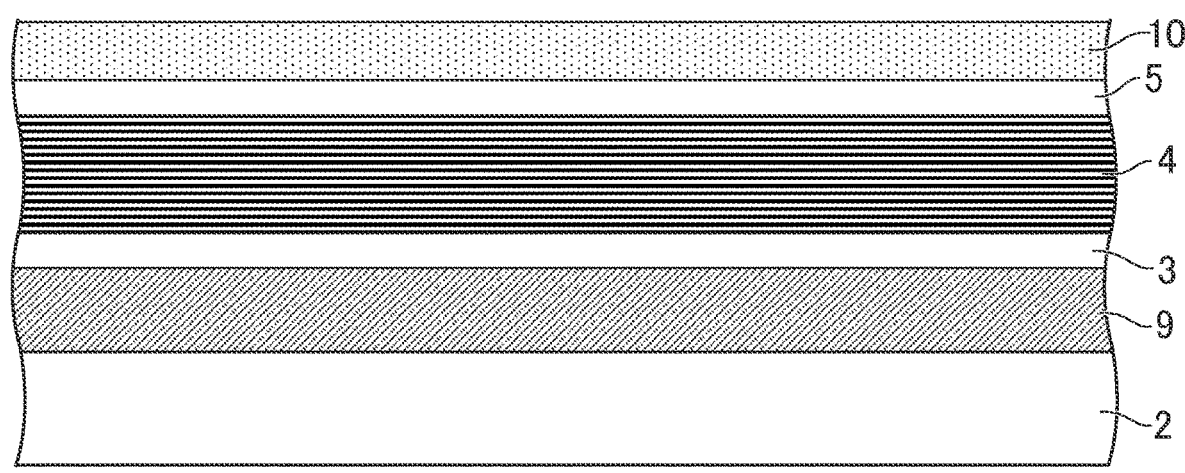

The present disclosure has a feature in the PL stabilization layer 9. In order to describe the effect of the PL stabilization layer 9, a process of manufacturing the semiconductor optical device 1 is described. First, as illustrated in FIG. 3, the PL stabilization layer 9, the n-type SCH layer 3, the MQW 4, the p-type SCH layer 5, and a cap layer 10 may be crystal grown over a top surface of the substrate 2. After the crystal growth, a PL measurement may be performed in order to check crystal quality of the MQW 4. The PL measurement may be performed by allowing excitation light having a wavelength that can be absorbed by the MQW 4 and the PL stabilization layer 9 to enter the semiconductor optical device 1 from a surface of the cap layer 10, and measuring spontaneous emission light (PL light) from the semiconductor optical device 1. It is also possible to allow the excitation light to enter from the substrate 2 side, but because the excitation light may be absorbed and scattered by the substrate 2, which may be sufficiently thick as compared to the other layers, it may be preferred to allow the excitation light to enter the semiconductor optical device 1 from the cap layer 10 side for stable evaluation. The cap layer 10 may be a layer provided to protect the p-type SCH layer 5 and layers below the p-type SCH layer 5 during other processes in manufacturing, for example, the PL measurement, and may be a layer that may be removed prior to finishing manufacturing of the semiconductor optical device 1. Thus, the cap layer 10 may not be included in the finished semiconductor optical device 1.

In the PL measurement, a wavelength spectrum of a wavelength corresponding to a band gap of each layer may be measured. The PL measurement may be a method of checking crystal quality by evaluating an emission intensity or a full width at half maximum, for example, of the wavelength spectrum. In order to check the crystal quality of the MQW 4, it may be required that the wavelength of the excitation light be shorter than a composition wavelength of well layers constituting the MQW 4. At this time, the well layers may be too thin to absorb the excitation light sufficiently in some cases. Further, when a composition wavelength of each of the n-type SCH layer 3 and the p-type SCH layer 5 is shorter than the wavelength of the excitation light, the excitation light may be not absorbed by the two SCH layers. As a result, an intensity of PL light output from the MQW 4 may be too low to perform accurate PL measurement in some cases. However, in the present disclosure, the PL stabilization layer 9 may be included, and hence stable PL measurement can be achieved. The PL stabilization layer 9 may be formed to have a composition wavelength with which the excitation light can be absorbed. Thus, the excitation light that has not been absorbed by the MQW 4 (excitation light that has been transmitted through the MQW 4) may be absorbed by the PL stabilization layer 9. Electrons and holes (carriers) are generated by the excitation light absorbed by the PL stabilization layer 9. A portion of the generated carriers may be moved to the MQW 4 by energy, for example, heat. The moved carriers recombine in the MQW 4 to output the PL light. Consequently, the intensity of the PL light from the MQW 4 may be increased, and accurate PL measurement can be achieved. A composition wavelength of the PL stabilization layer 9 may be shorter than a composition wavelength of the well layers of the MQW 4. If the composition wavelength of the PL stabilization layer 9 is longer than that of the well layers, the carriers excited by the PL stabilization layer 9 may recombine in the PL stabilization layer 9, and the PL light from the semiconductor optical device 1 may be mainly light emitted from the PL stabilization layer 9. Thus, the PL light of the MQW 4 becomes lower, and the crystal evaluation of the MQW 4 cannot be performed. Further, it may be desired that the composition wavelength of the PL stabilization layer 9 be longer than a composition wavelength of the n-type SCH layer 3. When the composition wavelength of the n-type SCH layer 3 is longer than the composition wavelength of the PL stabilization layer 9, the excitation light can also be absorbed by the n-type SCH layer 3, and hence the PL measurement can be stably performed even without the PL stabilization layer 9. In this case, the PL stabilization layer 9 may not be required. It should be noted, however, that there are cases in which, even when the n-type SCH layer 3 has a composition wavelength with which the excitation light can be absorbed, the PL stabilization layer 9 exerts its effect as described later.

In some implementations, a thickness of the PL stabilization layer 9 may be half a thickness of the MQW 4 or more. Further, when the thickness of the PL stabilization layer 9 is set to twice a total thickness of layers that can absorb the excitation light excluding the MQW 4 or more, a stable PL measurement can be achieved. For example, when the n-type SCH layer 3 and the p-type SCH layer 5 (the n-type SCH layer 3 and the p-type SCH layer 5 are hereinafter collectively simply referred to as "SCH layers") also have a composition wavelength with which the excitation light can be absorbed, the carriers generated in the SCH layers move to the MQW 4, and are output as the PL light. However, when the SCH layers are thin, an amount of the carriers to be supplied may be small, and thus the PL light intensity remains low. However, when the PL stabilization layer 9 has a thickness that is twice a total thickness of the n-type SCH layer 3 and the p-type SCH layer 5, or more, is included, sufficient carriers can be supplied.

Further, a composition wavelength of the SCH layers may deviate from a design value due to a variation at the time of manufacture in some cases. For example, when the composition wavelength of the SCH layers and the wavelength of the excitation light are close to each other, the composition wavelength of the SCH layers may be a wavelength with which the excitation light may be absorbed in some cases, and may be a wavelength with which the excitation light may be not absorbed in other cases due to the manufacturing variation. Depending on whether the excitation light is or is not absorbed in the SCH layers, a number of carriers to be supplied to the MQW is changed, and hence the intensity of PL light from the MQW changes. However, when the PL stabilization layer 9 is included, the carriers can be stably supplied to the MQW regardless of whether the excitation light is or is not absorbed in the SCH layers. In the structure including the PL stabilization layer 9, the intensity of PL light generated by the MQW may be changed depending on whether the excitation light is or is not absorbed in the SCH layers. However, a spectrum shape of the PL light generated in the MQW is stable, and hence the PL measurement can be stably performed.

Figure 4:
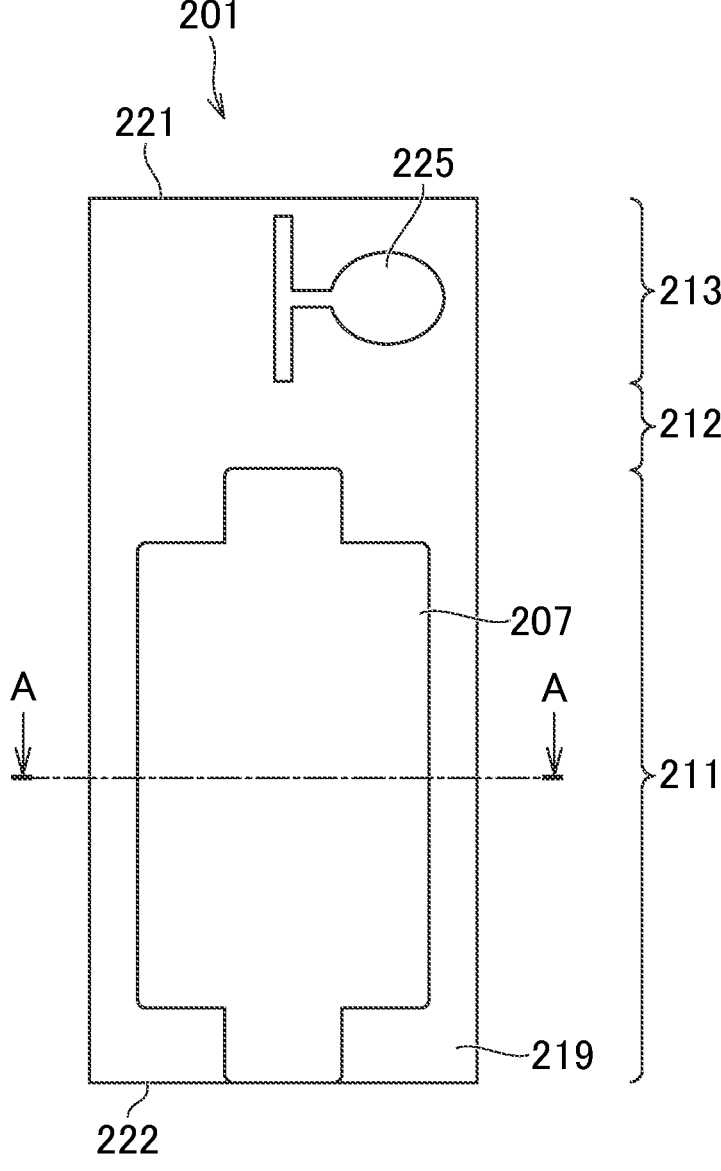
FIG. 4 is a top view of a semiconductor optical device according to a second example implementation of the present disclosure.

FIG. 4 is a top view of a semiconductor optical device 201 according to a second example implementation of the present disclosure. The semiconductor optical device 201 may be a modulator integrated semiconductor laser in which a semiconductor laser 211, an electro-absorption modulator (EA modulator) 213, and a waveguide 212 are integrated in one unit. In the second example implementation, an example of an integrated type is described, but the present disclosure can provide effects even as a semiconductor laser alone or an EA modulator alone. The semiconductor optical device 201 may be an integrated device in which the semiconductor laser 211, the waveguide 212, and the EA modulator 213 are optically connected to one another in the stated order. The semiconductor laser 211 outputs continuous light, and the waveguide 212 transmits the light output by the semiconductor laser 211 to the EA modulator 213. The EA modulator 213 includes a multi quantum well layer which absorbs light corresponding to an oscillation wavelength of the semiconductor laser 211. The continuous light that has passed through the waveguide 212 and has entered the EA modulator 213 may be intensity-modulated by the EA modulator 213 to be converted into a binary or quaternary modulated optical signal, for example. The modulated optical signal that has been output from the EA modulator 213 may be output from a front-end face 221. A window structure in which other structure, for example, semi-insulating InP, may be arranged near the front-end face 221 may be included. A dielectric non-reflective film (not shown) may be formed on the front-end face 221. Further, on a rear end face 222, which may be an end face on the opposite side of the semiconductor laser 211, a dielectric high-reflection film (not shown) may be formed. Further, although described later in detail, the semiconductor optical device 201 may be a buried type semiconductor device which has a mesa structure from the semiconductor laser 211 to the EA modulator 213, and in which the mesa structure may be buried by a semiconductor buried hetero layer (BH layer 215) on both sides thereof.

Figure 5:
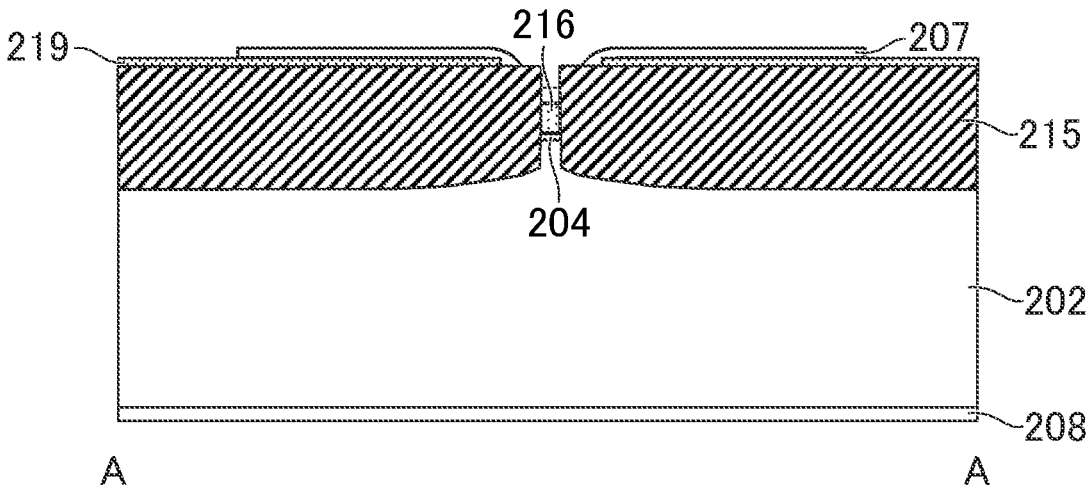
FIG. 5 is a sectional view taken along the line A-A of FIG. 4.

FIG. 5 is a schematic sectional view taken along the line A-A of FIG. 4, which may be perpendicular to an optical axis of the semiconductor laser 211. The mesa structure may be formed of a portion of a substrate 202 (n-InP substrate), a laser-section multi quantum well layer 204, a p-type cladding layer 216, and a p-type contact layer 218 illustrated in FIG. 6. In this example, the p-type cladding layer 216 may be formed of a p-InP layer. The mesa structure may be buried by a buried hetero layer (BH layer 215) on both sides thereof. Details of the mesa structure are described later. An insulating film 219 may be arranged on a top surface of the BH layer 215 except for a portion thereof. The insulating film 219 may be, for example, a silicon dioxide (SiO₂) film. A laser-section electrode 207 may be arranged over a portion of a top surface of the insulating film 219 and a top portion of the mesa structure. Further, a back electrode 208 may be arranged on a back surface of the substrate 202. Through application of a voltage (injection of an electric current) between the laser-section electrode 207 and the back electrode 208, the semiconductor laser 211 generates the continuous light.

Figure 6:
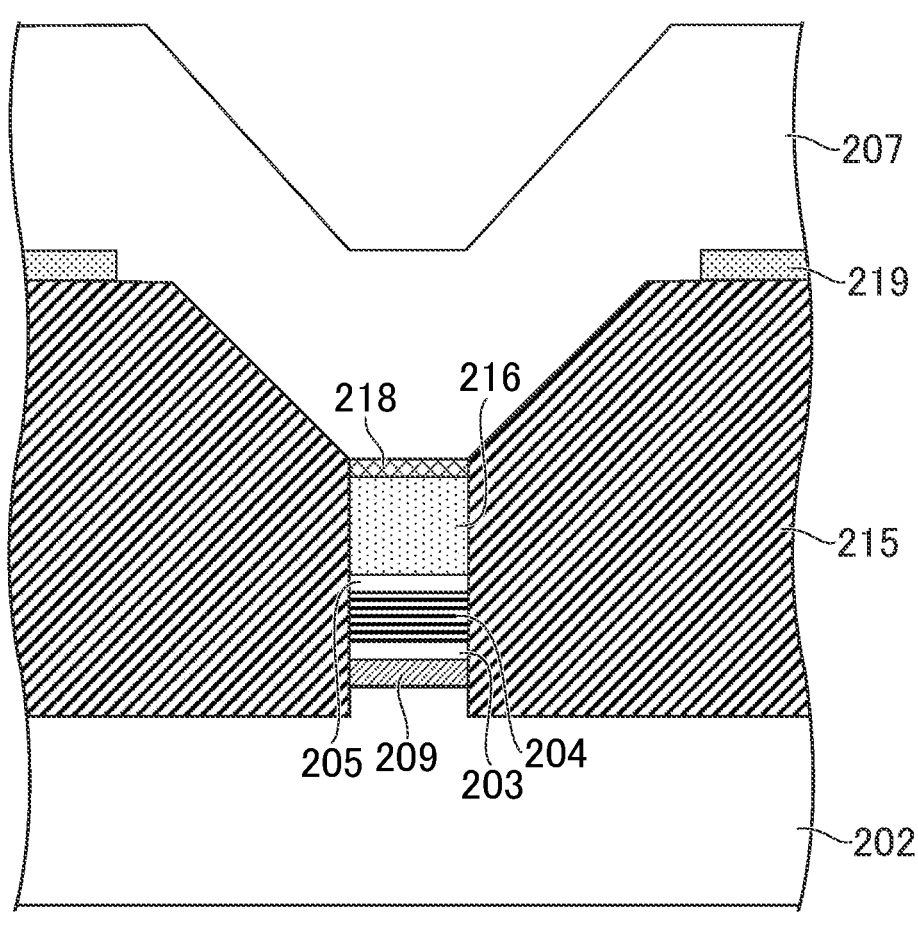
FIG. 6 is an enlarged view of FIG. 5.

FIG. 6 is an enlarged view near the mesa structure of the semiconductor laser 211 illustrated in FIG. 5. The mesa structure may be formed of a portion of the substrate 202, a PL stabilization layer 209, an n-type optical confinement layer (SCH layer) 203, the laser-section multi quantum well layer 204, a p-type SCH layer 205, the p-type cladding layer 216, and the p-type contact layer 218. Further, a grating may be formed in the p-type SCH layer 205, and the semiconductor laser 211 may be a distributed feedback (DFB) laser which oscillates in a 1.3-μm band. Further, the semiconductor laser 211 may be, without limiting to the DFB laser, a Fabry-Perot (FP) laser, a distributed Bragg reflector (DBR) laser, or a distributed reflector (DR) laser.

The PL stabilization layer 209 may be formed of an undoped indium gallium arsenide phosphide (InGaAsP) layer having a thickness of 100 nm and a composition wavelength of 1.1 μm. The n-type SCH layer 203 may be formed of n-type InGaAsP having a thickness of 25 nm and a composition wavelength of 1.05 μm. Further, the p-type SCH layer 205 may be formed of p-type InGaAsP having a thickness of 25 nm and a composition wavelength of 1.05 μm. In the laser-section multi quantum well layer 204, a plurality of barrier layers and well layers may be alternately arranged. The laser-section multi quantum well layer 204 starts with a barrier layer and ends with a barrier layer. In this example, each of the well layers and the barrier layers has a thickness of 8 nm. The barrier layers are made of undoped InGaAsP and have a composition wavelength of 1.08 μm, and the well layers are made of undoped InGaAsP and have a composition wavelength of 1.28 μm. The laser-section multi quantum well layer 204 as a whole has a composition adapted for a 1.3-μm band. The p-type cladding layer 216 may be a p-type InP layer, and has a thickness of 1500 nm. The composition wavelengths and thicknesses described herein are merely an example taken to describe in detail the structure with which the effects of the present disclosure are obtained, and the effects of the present disclosure can be obtained also with different composition wavelengths and thicknesses.

Figure 7:
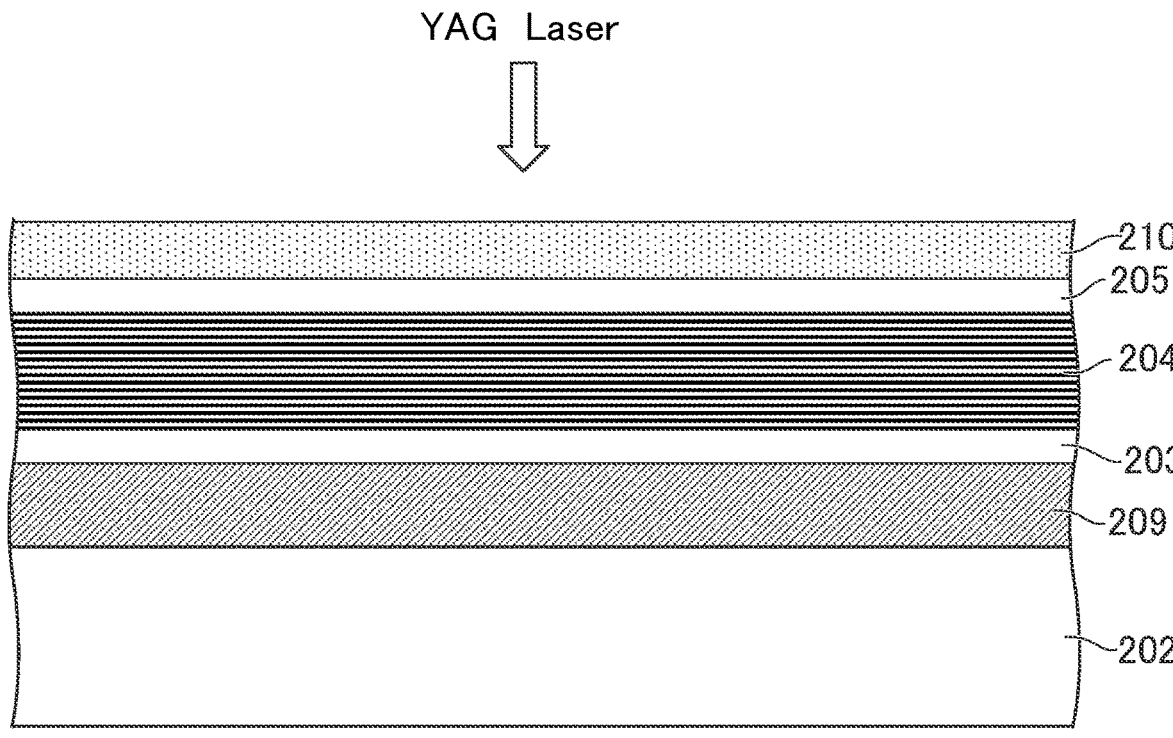
FIG. 7 is a sectional view in course of manufacturing a semiconductor laser according to the second example implementation.

The present disclosure has a feature in the PL stabilization layer 209. In order to describe the effect of the PL stabilization layer 209, a process of manufacturing the semiconductor optical device 201, in particular, a process of manufacturing the semiconductor laser 211 is described. First, as illustrated in FIG. 7, the PL stabilization layer 209, the n-type SCH layer 203, the laser-section multi quantum well layer 204, the p-type SCH layer 205, and a p-type InP cap layer 210 are crystal-grown over a top surface of the substrate 202. An n-InP buffer layer may be arranged between the substrate 202 and the PL stabilization layer 209. After the crystal growth, the PL measurement may be performed in order to check crystal quality of the laser-section multi quantum well layer 204. The PL measurement may be performed by irradiating YAG laser having an oscillation wavelength of 1,064 nm from a front surface side of the p-type InP cap layer 210, and measuring light emission (PL light) in the semiconductor laser 211.

Output light (excitation light) of the YAG laser may be 1,064 nm (1.064 μm). Thus, the excitation light may be absorbed by a layer having a composition wavelength that is longer than that wavelength, and is transmitted through a layer having a composition wavelength that is shorter than 1.064 μm. In the case of this configuration, the excitation light may be absorbed by the well layers and the PL stabilization layer 209.

Figure 8:
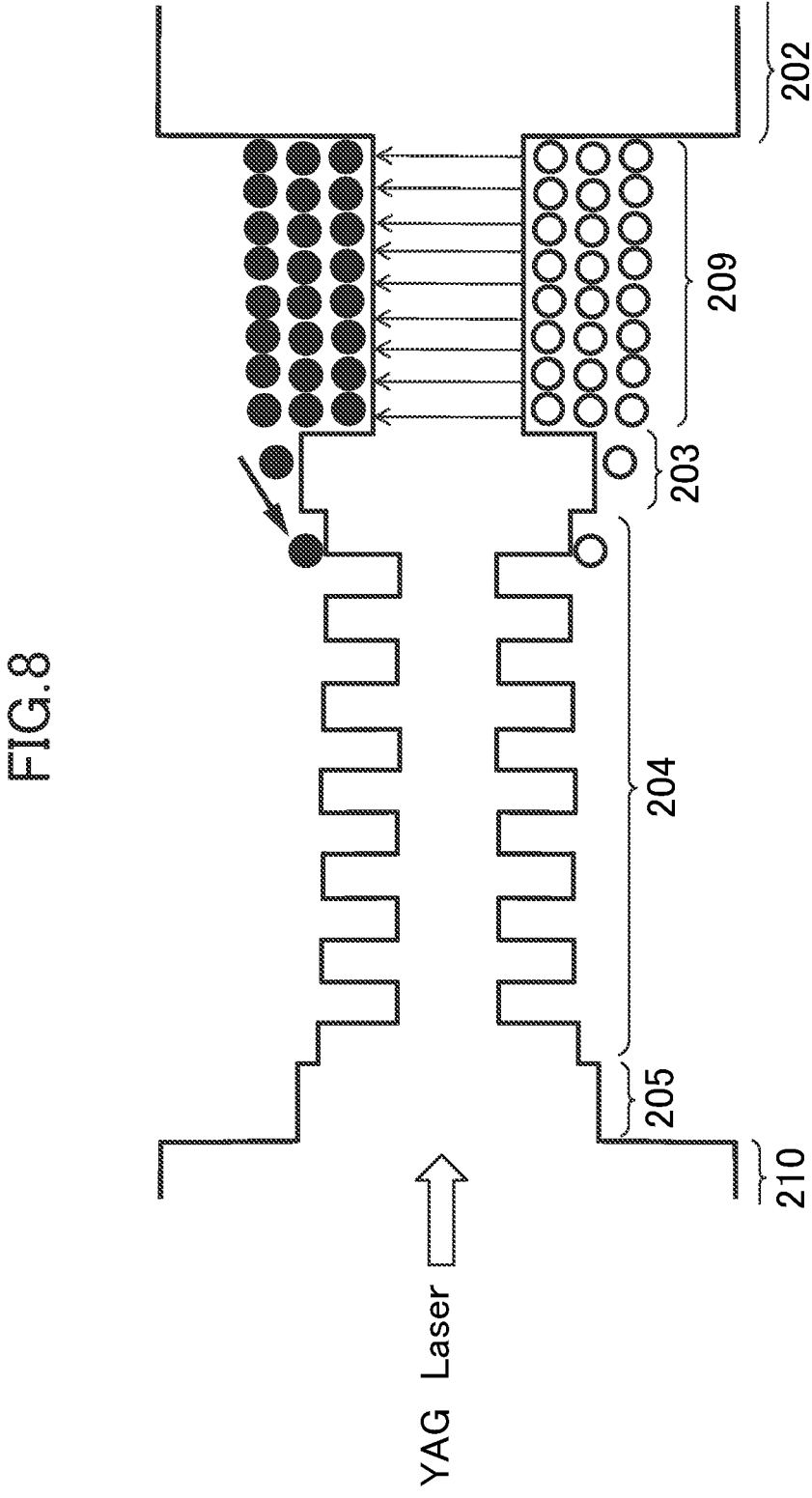
FIG. 8 is a schematic band diagram of the semiconductor laser according to the second example implementation.

FIG. 8 is a band diagram for schematically illustrating light absorption of the semiconductor laser 211 when the YAG laser enters the semiconductor laser 211. The excitation light may be absorbed by the well layers to generate pairs of an electron and a hole. When the electron and the hole recombine, PL light having a wavelength spectrum corresponding to a band gap of the laser-section multi quantum well layer 204 may be output. Not all the excitation light may be absorbed by the well layers, and a part thereof reaches the substrate 202. At this time, the excitation light may be also absorbed by the PL stabilization layer 209. The electrons and holes (carriers) are generated by the excitation light absorbed by the PL stabilization layer 209. A part of the generated carriers may be moved to the laser-section multi quantum well layer 204 side by energy, for example, heat. The moved carriers recombine in the laser-section multi quantum well layer 204 to output the PL light. The PL stabilization layer 209 has the thickness of 100 nm, and hence sufficiently absorbs the excitation light. Thus, the carriers for PL light emission are sufficiently supplied to the laser-section multi quantum well layer 204. As a result, the PL light output by the laser-section multi quantum well layer 204 has an enough intensity to check the quality.

Meanwhile, as described in the problem, the composition wavelength of SCH layers of a 1.3-μm band semiconductor optical device may be often close to the wavelength of the YAG laser. In the second example implementation, the composition wavelength of each of the n-type SCH layer 203 and the p-type SCH layer 205 may be 1.05 μm. However, even when a design composition wavelength is 1.05 μm, manufacturing variation of about ±0.03 μm with respect to the design wavelength occurs. If the composition wavelength varies toward the longer side, the composition wavelength of the SCH layers may be a composition wavelength with which light having a wavelength of 1.064 μm is absorbed. Conversely, when the composition wavelength of the SCH layers varies toward the shorter side, the composition wavelength deviates from 1.064 μm. As a result, variation in absorption amount of the excitation light occurs. When the composition wavelength of the SCH layers is shifted toward the longer side, the excitation light may be absorbed, and the carriers are supplied to the laser-section multi quantum well layer 204 to increase the PL light intensity. Meanwhile, when the composition wavelength of the SCH layers is shifted toward the shorter side, the excitation light may be not absorbed, and may be absorbed only by the well layers. Thus, the PL light intensity may be low as compared to the case in which the composition wavelength of the SCH layers is shifted toward the longer side. In other words, when a plurality of semiconductor optical devices having the same structure are manufactured, the PL light intensity varies depending on the composition wavelength of the completed SCH layers, and it becomes difficult to determine which is an accurate PL measurement. As a result, stable mass production becomes difficult.

In contrast, when the PL stabilization layer 209 is formed to have a sufficient thickness as compared to the other layers, and have the composition wavelength with which light of the YAG laser is reliably absorbed as described above, the PL stabilization layer 209 can reliably absorb the excitation light to supply the carriers to the laser-section multi quantum well layer 204. When a certain number of electrons are supplied, the intensity of the PL light becomes stable. In order to stably absorb light, the thickness of the PL stabilization layer 209 may be 100 nm or more. Further, if the composition wavelength of the SCH layers varies, and the SCH layers absorbs the excitation light to generate the carriers, for example, the carriers also move to the laser-section multi quantum well layer 204 and are observed as the PL light. Accordingly, the variation in composition wavelength of the SCH layers becomes a cause for the intensity of the PL light to vary. In order to avoid such situation, by ensuring that the amount of light absorbed by the PL stabilization layer 209 is sufficiently large with respect to the light absorbed by the SCH layers, the effect of the light absorption by the SCH layers can be reduced. For that reason, the PL stabilization layer 209 may be thicker than that of the n-type SCH layer 203 and/or the PL stabilization layer 209 be twice a total thickness of the layers each having a composition wavelength with which the YAG laser light can be absorbed excluding the laser-section multi quantum well layer 204 or more. The layers each having the composition wavelength with which the YAG laser light can be absorbed in this example indicate layers each having a composition wavelength that is shorter than 1.064 μm. When the excitation light source is not a YAG laser, the layers each having a composition wavelength with which the excitation light can be absorbed indicate layers each having a composition wavelength that may be shorter than a wavelength of the excitation light source. In the second example implementation, layers having a possibility of absorbing the YAG laser light due to manufacturing variation are the n-type SCH layer 203 and the p-type SCH layer 205. A total thickness of the two layers may be 50 nm. Meanwhile, the thickness of the PL stabilization layer 209 may be 100 nm, and the effect on the PL light intensity due to the variation in composition wavelength of the SCH layers can be reduced. Consequently, the present disclosure is effective when the composition wavelength of the SCH layers is 1.03 μm or more and 1.09 μm or less.

Further, in order to avoid the effect due to the variation in composition wavelength of the completed PL stabilization layer 209, the composition wavelength of the PL stabilization layer 209 may be 1.1 μm or more and/or the composition wavelength of the PL stabilization layer 209 may be shorter than the composition wavelength of the well layers. When the composition wavelength of the PL stabilization layer 209 is longer than that of the well layers, a ratio of carriers recombining in the PL stabilization layer 209 before recombining in the laser-section multi quantum well layer 204 becomes higher, and the carriers cannot be sufficiently supplied to the laser-section multi quantum well layer 204. Further, when an energy barrier with respect to the adjacent n-type SCH layer 203 is too high, carriers generated in the PL stabilization layer 209 become difficult to move toward the laser-section multi quantum well layer 204 side. Accordingly, the PL stabilization layer 209 may have the energy barrier that is 0.23 μm or less in terms of composition wavelength with respect to the adjacent layer. In the second example implementation, the composition wavelength of the PL stabilization layer 209 may be 1.28 μm or less. Still further, the present disclosure is particularly effective when the composition wavelength of the PL stabilization layer 209 is longer than the composition wavelength of the n-type SCH layer 203. When the composition wavelength of the n-type SCH layer 203 is longer than the composition wavelength of the PL stabilization layer 209, the YAG laser light is absorbed by the n-type SCH layer 203, and the excitation light is absorbed even without the PL stabilization layer 209. In this case, the advantage of arranging the PL stabilization layer 209 becomes less significant. Nonetheless, from the viewpoint of supplying more carriers to the laser-section multi quantum well layer 204, there is an advantage in arranging the PL stabilization layer 209.

The PL stabilization layer 209 may be an n-type layer having a low concentration as compared to the substrate 202 and the n-type SCH layer 203, or an undoped layer. The term "low concentration" as used herein indicates a carrier concentration of less than $1 \times 10^{17}/\text{cm}^3$. Further, the term "undoped layer" indicates a layer which may be intentionally not doped with impurities, and also includes a case of containing impurities on the background level. When the PL stabilization layer 209 is an n-type layer having a high concentration, for example, a concentration of $1 \times 10^{17}/\text{cm}^3$ or more, a substantial energy gap becomes higher. In other words, an effective absorption wavelength of the PL stabilization layer 209 shifts toward the shorter side. A composition with which the excitation light cannot be absorbed results, to thereby result in a fear that the stability of the PL measurement may be reduced.

After the quality of the semiconductor laser 211 is checked by the PL measurement through the process described above, multilayer growth may be performed also for the EA modulator 213 by using a known lithography technology, butt joint method, or crystal growth method. Also, in generating the EA modulator 213, through arrangement of the PL stabilization layer 209 as in the semiconductor laser 211, quality of the multi quantum well layer of the EA modulator can be checked. Similarly, the waveguide 212 may be formed, and the p-type cladding layer 216 and the p-type contact layer 218 may be formed over the waveguide 212. Before the p-type cladding layer 216 is formed, the grating may be formed in the p-type SCH layer 205 of the semiconductor laser 211. After the multilayer growth, the mesa structure may be formed, and the BH layer 215 may be formed on both sides of the mesa structure. Further, the insulating film 219, the laser-section electrode 207, and a modulator-section electrode 225 may be formed on the front surface. Further, after the substrate 202 is ground to be thin, the back electrode 208 may be formed on the back surface. Final chipping completes the semiconductor optical device 201.

The PL stabilization layer 209 may have a small band gap as compared to the n-type SCH layer 203. In general, by configuring the band gap to be increased gradually from the barrier layers of the multi quantum well layer 4 toward the substrate 202 serving as a base, smooth movement of the carriers is allowed. Thus, in the semiconductor optical device 201, the PL stabilization layer 209 may become a barrier for carrier movement at the time of being actually driven. However, the semiconductor laser 211 oscillates the continuous light, and hence it may not be configured for a particular speed of the carrier movement. Accordingly, even when the PL stabilization layer 209 in the present disclosure is included, actual use can be sufficiently supported. When the EA modulator 213 or this structure is applied to a direct-modulation semiconductor laser, supported modulation speeds may be restricted in some cases. In this case, by making the PL stabilization layer 209 as thin as possible, and making the band gap with respect to an adjacent layer small, the effect of the reduction in supported speed can be suppressed. Specifically, in the case of a semiconductor optical device adapted for the 1.3-μm band, the composition wavelength of the PL stabilization layer 209 may be 1.1 μm or more, at which the light can be absorbed reliably even under the effect of manufacturing variation, and the thickness be 300 nm or less. For the other wavelength bands, the thicknesses described in relation to the first implementation may be adopted, for example.

Further, the PL stabilization layer 209 may be arranged on the "n" side as viewed from the multi quantum well layer 4. When arranged on the "p" side, with the PL stabilization layer 209 being undoped, a high energy barrier may be generated, and thereby an effect on characteristics may become significant even in a semiconductor laser. The PL stabilization layer 209 is not limited to InGaAsP as long as the PL stabilization layer 209 has the composition wavelength with which the YAG laser light can be absorbed. For example, the PL stabilization layer 209 may be made of indium gallium aluminum arsenide (InGaAlAs).

Figure 9:
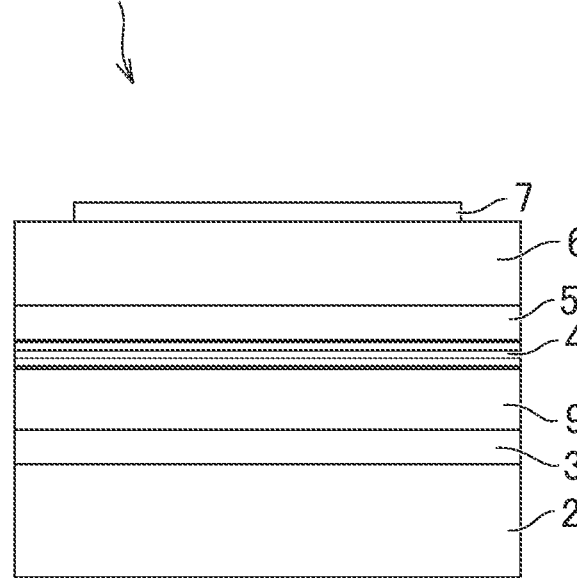
FIG. 9 is a sectional view of a semiconductor optical device according to a third example implementation of the present disclosure, which corresponds to a cross section taken along the line A-A of FIG. 1.

FIG. 9 is a sectional view of a semiconductor optical device 301 according to a third example implementation of the present disclosure. As shown in FIG. 9, the positions of the PL stabilization layer 9 and the n-type SCH layer 3 are opposite to each other.

In the third example implementation, with the PL stabilization layer 9 being close to the multi quantum well layer 4, carriers can be supplied more stably during the PL measurement. It should be noted, however, that an optical confinement ratio of the multi quantum well layer 4 may be reduced as compared to the first example implementation. When the optical confinement ratio is reduced, there are advantages that an internal loss may be reduced, and laser light of higher power can be oscillated. A disadvantage may be that, with the thick undoped layer (PL stabilization layer 9) being in proximity to the multi quantum well layer 4, a strength of an electric field applied on the multi quantum well layer 4 may be reduced. For example, when this structure may be applied to an EA modulator instead of a semiconductor laser, there may be a disadvantage that an extinction ratio is reduced.

Figure 10:
FIG. 10 is a sectional view of a semiconductor optical device according to a fourth example implementation of the present disclosure, which corresponds to a cross section taken along the line A-A of FIG. 1.
Figure 10:
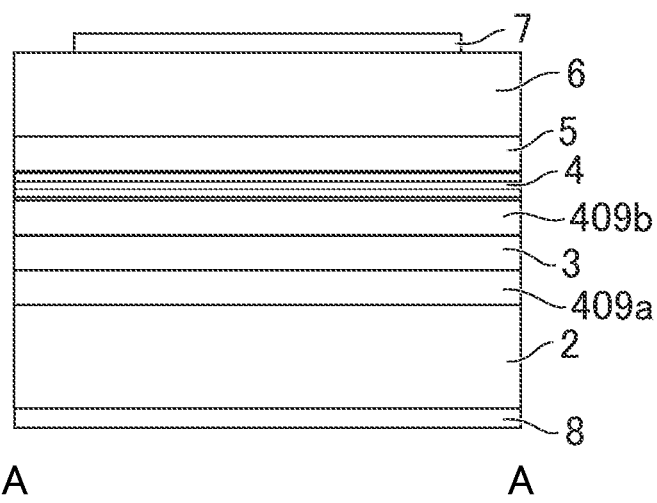

FIG. 10 is a sectional view of a semiconductor optical device 401 according to a fourth example implementation of the present disclosure. As shown, the PL stabilization layer is arranged as two separate layers. A first PL stabilization layer 409a, the n-type SCH layer 3, a second PL stabilization layer 409b, and the multi quantum well layer 4 may be grown in the stated order from the substrate 2 side. The first PL stabilization layer 409a and the second PL stabilization layer 409b both have the same composition wavelength, and both are undoped layers.

In the fourth example implementation, a total thickness of the first PL stabilization layer 409a and the second PL stabilization layer 409b may be the same as the thickness of the PL stabilization layer 9 in the first example implementation. Thus, as described in the first example implementation, stability of the PL measurement can be obtained. Further, with the PL stabilization layer being separated into two layers, as compared to the case of providing one PL stabilization layer, carrier stagnation at the time of modulation operation can be suppressed. The fourth example implementation is particularly effective in a semiconductor laser or EA modulator that is caused to perform a modulation operation, for example. In the fourth example implementation, the PL stabilization layer is formed of two layers. However, the present disclosure is not limited thereto, and the PL stabilization layer may be separated into three layers. SCH layers may be interposed, or other layers may be interposed among a plurality of PL stabilization layers. When a plurality of PL stabilization layers is provided, each of the PL stabilization layers may have the composition wavelength in the above-mentioned range, and be undoped. The total thickness of the plurality of PL stabilization layers may be 100 nm or more and 300 nm or less.

As described above, with the arrangement of the PL stabilization layer between the multi quantum well layer and the n-type semiconductor substrate, the PL light intensity in the PL measurement can be stabilized, and thus inspection of crystal quality can be performed accurately.

Further, there has been described the example in which only the PL stabilization layer and the SCH layers are arranged between the multi quantum well layer 4 and the substrate 2. However, the present disclosure is not limited thereto, and other layers may be provided therebetween. Still further, the ideas described in the third example implementation and the fourth example implementation may be combined with the second example implementation.

While there have been described what are at present considered to be certain implementations of the invention, it will be understood that various modifications may be made thereto, and it is intended that the appended claims cover all such modifications as fall within the true spirit and scope of the invention.

The foregoing disclosure provides illustration and description, but may be not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A semiconductor optical device, comprising:
a substrate of a first conductivity type;
a first optical confinement layer of the first conductivity type arranged above the substrate;
a multi quantum well layer arranged above the first optical confinement layer,
   wherein the multi quantum well layer comprises a plurality of well layers and a plurality of barrier layers;
a second optical confinement layer of a second conductivity type arranged on the multi quantum well layer; and
a photoluminescence (PL) stabilization layer arranged between the substrate and the multi quantum well layer,
the PL stabilization layer having a thickness that is half a thickness of the multi quantum well layer or more,
   the PL stabilization layer having a consistent band gap throughout the thickness of the PL stabilization layer, and
   an entirety of the PL stabilization layer having a composition wavelength that is shorter than a composition wavelength of the plurality of well layers, and is longer than a composition wavelength of the first optical confinement layer.

2. The semiconductor optical device of claim 1, wherein the PL stabilization layer has a carrier concentration of an undoped layer or less than $1 \times 10^{17}/\text{cm}^3$.

3. The semiconductor optical device of claim 1, wherein the composition wavelength of the PL stabilization layer is longer than a wavelength of excitation light to be used in PL measurement of the multi quantum well layer.

4. The semiconductor optical device of claim 3, wherein the first optical confinement layer and the second optical confinement layer each have a composition wavelength that is longer than the wavelength of excitation light.

5. The semiconductor optical device of claim 1, wherein the thickness of the PL stabilization layer is twice a total thickness of the first optical confinement layer and the second optical confinement layer or more.

6. The semiconductor optical device of claim 1, wherein the PL stabilization layer is arranged between the substrate and the first optical confinement layer.

7. The semiconductor optical device of claim 1, wherein the PL stabilization layer is arranged between the multi quantum well layer and the first optical confinement layer.

8. The semiconductor optical device of claim 1, wherein the first conductivity type is an n-type, and the second conductivity type is a p-type.

9. The semiconductor optical device of claim 1, wherein the multi quantum well layer is configured to emit or absorb 1.3-μm band light,
   wherein the composition wavelength of the PL stabilization layer is 1.1 μm or more, and
   wherein the thickness of the PL stabilization layer is thicker than a thickness of the first optical confinement layer.

10. The semiconductor optical device of claim 9, wherein the composition wavelength of the PL stabilization layer is 1.28 μm or less.

11. The semiconductor optical device of claim 9, wherein the first optical confinement layer and the second optical confinement layer each have a composition wavelength of 1.03 μm or more and 1.09 μm or less.

12. The semiconductor optical device of claim 1, wherein the thickness of the PL stabilization layer is 100 nm or more and 300 nm or less.

13. The semiconductor optical device of claim 1, wherein the semiconductor optical device is a semiconductor laser.

14. An apparatus, comprising:
a substrate of a first conductivity type;
a photoluminescence (PL) stabilization layer above the substrate;
a first optical confinement layer of the first conductivity type above the PL stabilization layer;
a multi quantum well layer above the first optical confinement layer,
   wherein the multi quantum well layer comprises a plurality of well layers and a plurality of barrier layers; and
a second optical confinement layer of a second conductivity type on the multi quantum well layer,
   wherein the PL stabilization layer has a band gap that is larger than a band gap of the plurality of well layers, and is smaller than a band gap of the first optical confinement layer,
   wherein the band gap of the PL stabilization layer is consistent through a thickness of the PL stabilization layer, and
   wherein the thickness of the PL stabilization layer is half or more of a thickness of the multi quantum well layer.

15. The apparatus of claim 14, wherein a composition wavelength of the PL stabilization layer is longer than a wavelength of excitation light to be used in PL measurement of the multi quantum well layer.

16. The apparatus of claim 15, wherein the first optical confinement layer and the second optical confinement layer each have a composition wavelength that is longer than the wavelength of excitation light.

17. The apparatus of claim 14, wherein a composition wavelength of the PL stabilization layer is 1.1 μm or more.

18. The apparatus of claim 17, wherein the composition wavelength of the PL stabilization layer is 1.28 μm or less.

19. The apparatus of claim 14, wherein the first optical confinement layer is arranged on the PL stabilization layer.

20. The apparatus of claim 14, wherein the PL stabilization layer is arranged on the substrate.

\* \* \* \* \*